(12) United States Patent
Pagani

(10) Patent No.: US 9,209,385 B2
(45) Date of Patent: Dec. 8, 2015

(54) MAGNETIC SENSOR INTEGRATED IN A CHIP FOR DETECTING MAGNETIC FIELDS PERPENDICULAR TO THE CHIP AND MANUFACTURING PROCESS THEREOF

(71) Applicant: STMicroelectronics S.r.l., Agrate Brianza (IT)

(72) Inventor: Alberto Pagani, Nova Milanese (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 14/168,754

(22) Filed: Jan. 30, 2014

(65) Prior Publication Data

US 2014/0217533 A1   Aug. 7, 2014

(30) Foreign Application Priority Data

Feb. 4, 2013   (IT) .............................. TO2013A0086

(51) Int. Cl.
*H01L 43/02* (2006.01)
*G01R 33/00* (2006.01)
*G01R 33/04* (2006.01)

(52) U.S. Cl.
CPC ............ *H01L 43/02* (2013.01); *G01R 33/0005* (2013.01); *G01R 33/0011* (2013.01); *G01R 33/0047* (2013.01); *G01R 33/04* (2013.01); *H01L 2224/16227* (2013.01); *H01L 2224/48091* (2013.01); *H01L 2224/48227* (2013.01); *H01L 2924/00014* (2013.01); *H01L 2924/15311* (2013.01); *H01L 2924/18161* (2013.01)

(58) Field of Classification Search
CPC ....................................... H01L 43/02
USPC ....................................... 257/427
See application file for complete search history.

(56) References Cited

U.S. PATENT DOCUMENTS

| | | | |
|---|---|---|---|
| 6,396,114 B1 | 5/2002 | Yoshinaga | |
| 6,404,192 B1 | 6/2002 | Chiesi et al. | |
| 8,395,472 B2 | 3/2013 | Roozeboom et al. | |
| 2003/0173963 A1* | 9/2003 | Choi et al. ..................... | 324/253 |
| 2003/0231093 A1* | 12/2003 | Hsu et al. ..................... | 336/200 |
| 2005/0190035 A1 | 9/2005 | Wang | |
| 2010/0164671 A1 | 7/2010 | Pagani et al. | |
| 2011/0193556 A1 | 8/2011 | Paci et al. | |
| 2012/0056705 A1* | 3/2012 | Kim et al. ..................... | 336/200 |

(Continued)

FOREIGN PATENT DOCUMENTS

| | | |
|---|---|---|
| JP | 11-261131 A | 9/1999 |
| JP | 2000340856 A | 12/2000 |

OTHER PUBLICATIONS

R S Popovic "Hall Effect Devices", Chapter 1, 2004 IOP Publishing.

(Continued)

*Primary Examiner* — Edward Wojciechowicz
(74) *Attorney, Agent, or Firm* — Seed IP Law Group PLLC

(57) ABSTRACT

An integrated magnetic sensor formed by a semiconductor chip having a surface and accommodating a magnetic via and a sensing coil. The magnetic via is formed by a cylindrical layer of ferromagnetic material that extends perpendicular to the surface of the first chip and has in cross-section an annular shape of a circular or elliptical or curvilinear type. The sensing coil surrounds the magnetic via at a distance and is connected to an electronic circuit.

29 Claims, 7 Drawing Sheets

(56) References Cited

U.S. PATENT DOCUMENTS

2012/0153745 A1   6/2012  Pagani
2013/0252348 A1*  9/2013  Hsieh et al. .................. 438/3

OTHER PUBLICATIONS

R S Popovic "Hall Effect Devices", Chapter 5, 2004 IOP Publishing.

* cited by examiner

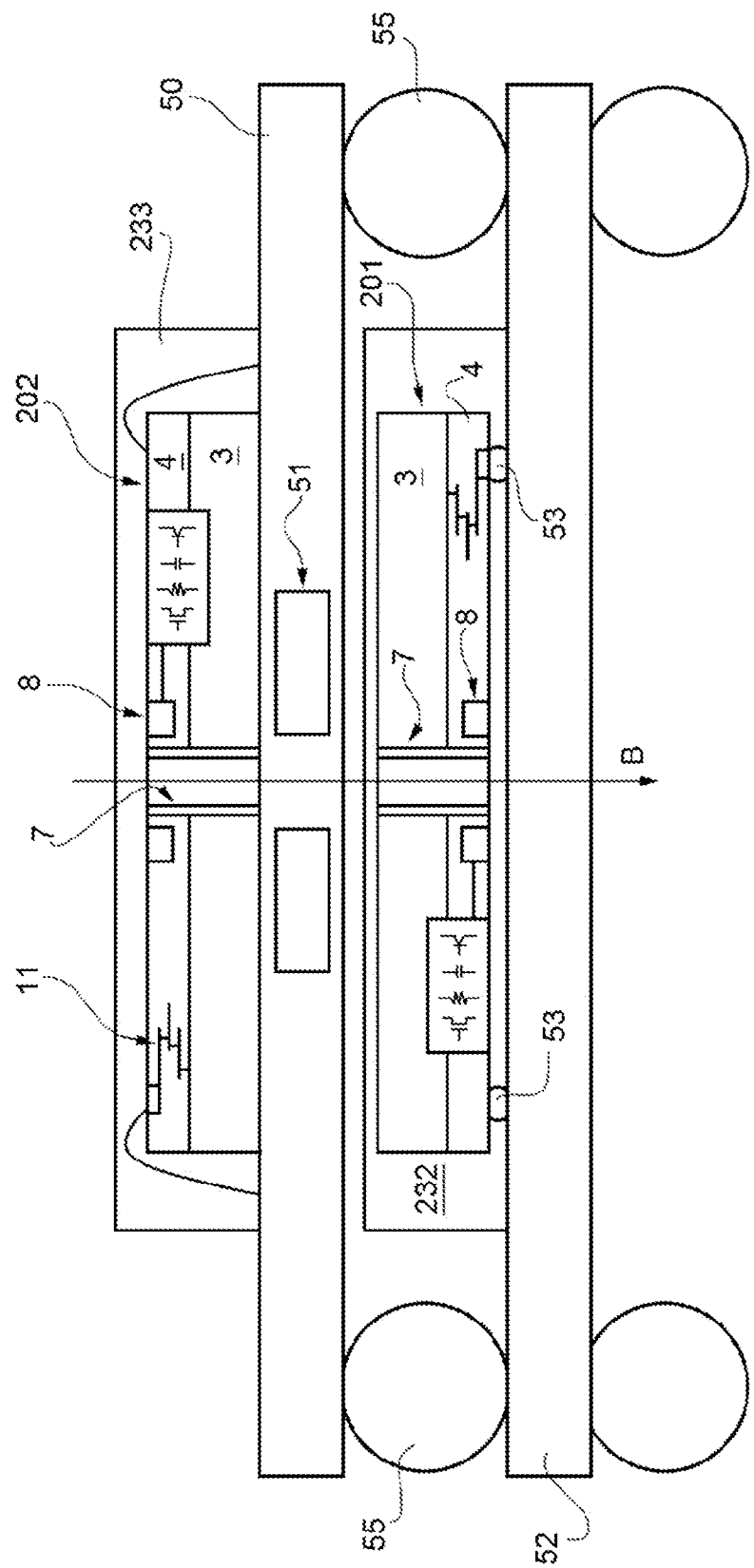

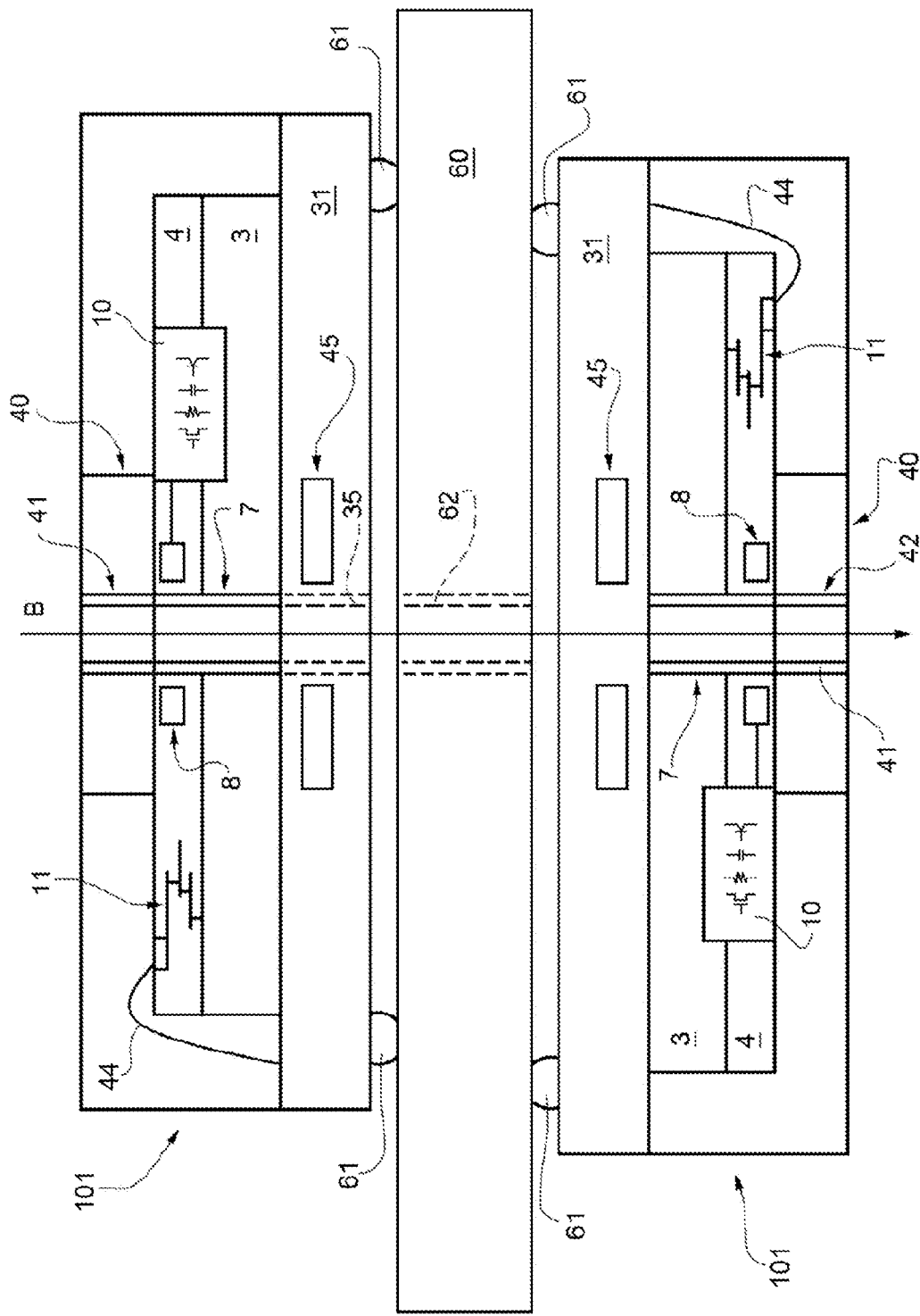

MAGNETIC SENSOR INTEGRATED IN A CHIP FOR DETECTING MAGNETIC FIELDS PERPENDICULAR TO THE CHIP AND MANUFACTURING PROCESS THEREOF

BACKGROUND

1. Technical Field

The present disclosure relates to a magnetic sensor integrated in a chip for detecting magnetic fields perpendicular to the chip and to the manufacturing process thereof.

2. Description of the Related Art

Various sensors are known that are able to detect magnetic fields parallel to the surface of a chip integrating the sensor. On the other hand, production of magnetic sensors sensitive to magnetic fields perpendicular to the surface of a chip (for example, for electronic compasses) is problematic. In fact, integrated magnetic sensors currently available on the market are substantially sensitive to fields directed parallel to the plane of the sensor (plane XY), and a sensor that is sensitive along the axis Z is obtained by arranging the chip of the corresponding sensor in a direction perpendicular to the chips of the X and Y sensors. However, in this case, the assembly and calibration operations are complex, and the finished device is costly. In addition, the packaged device has a large volume (in particular, in height), which does not enable use thereof in small apparatuses.

In order to solve this problem, it has already been proposed to use a Hall-effect sensor overlaid by a magnetic structure that collects and concentrates vertical magnetic fields perpendicular to the chip (see, for example, patent abstracts JP2000340856 and U.S. Pat. No. 6,396,114). These solutions are, however, sensitive to the magnetic fields directed in a transverse direction (parallel to the chip), which are not separated from perpendicular magnetic fields. In fact, the presence of horizontal portions (parallel to the chip surface) or portions having a horizontal component causes a deformation of the magnetic field directed parallel to this portion, and thus reading errors.

US2011/0193556 describes embodiments of an integrated magnetic sensor wherein a concentrator of ferromagnetic material extends as far as near a Hall sensor. Here, the absence of magnetic or ferromagnetic layers parallel to the chip reduces the effects of parallel magnetic fields. Moreover, the distance between the concentrator and the Hall sensor determines in any case a loss of field lines of the concentrated field in the area between the concentrator and the Hall sensor, loss that cannot be eliminated since the ferromagnetic material may be a source of silicon contamination and may alter operation of the Hall-effect cell.

BRIEF SUMMARY

One or more embodiments of the present disclosure are directed to a magnetic sensor integrated in a chip for detecting magnetic fields perpendicular to the chip is provided. In particular, one embodiment includes an integrated magnetic sensor comprising a first chip having a first surface and a magnetic via in the first chip. The magnetic via may include a cylindrical layer of ferromagnetic material that extends to the first surface of the first chip and has, in cross-section, an annular shape. The sensor further includes a sensing coil located in the first chip and surrounding the magnetic via at a distance.

BRIEF DESCRIPTION OF THE SEVERAL VIEWS OF THE DRAWINGS

For a better understanding of the present integrated magnetic sensor, preferred embodiments thereof are now described, purely by way of non-limiting example, with reference to the attached drawings.

FIG. 11 shows a package-on-package arrangement of the sensor in accordance with one embodiment.

FIG. 12 shows a variant of the arrangement of FIG. 11.

DETAILED DESCRIPTION

Figure 1:
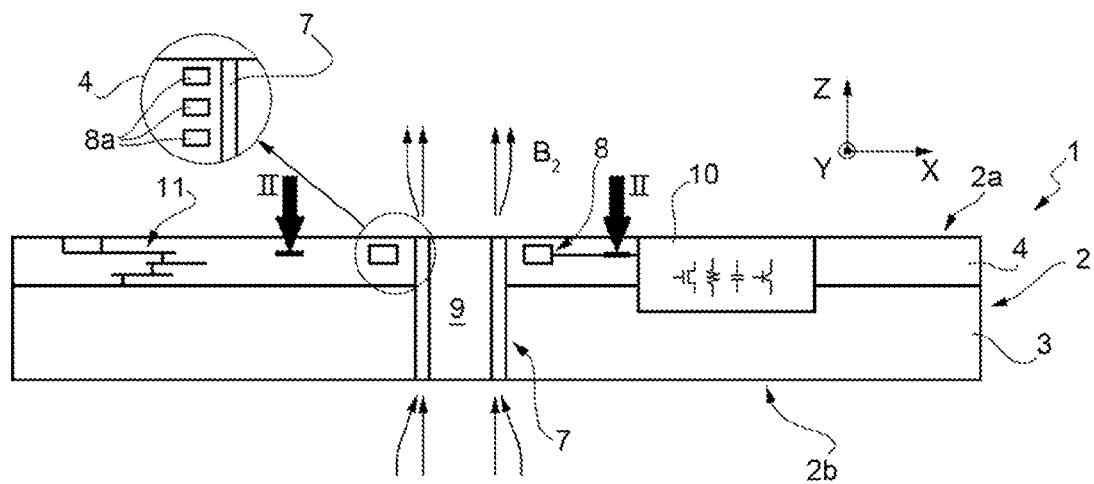
FIG. 1 is a cross-section of a semiconductor material chip integrating a sensor in accordance with one embodiment of the disclosure.

FIG. 1 shows a magnetic sensor 1 integrated in a chip 2 of semiconductor material, comprising a body 3 and an insulating layer 4 overlying the body 3. In a known manner, not shown, the body 3, for example of silicon, may in turn be formed by a substrate and by one or more epitaxial layers, and the insulating layer 4 may be formed by a plurality of dielectric layers. A plurality of metallization levels are interconnected by conductive vias inside the insulating layer. In a Cartesian reference system XYZ, the chip 2 has a first surface 2a and a second surface 2b (here a top surface, defined by the insulating layer 4, and a rear surface, defined by the body 3), which are parallel to a plane XY, and a thickness measured along an axis Z.

The magnetic sensor 1 comprises a magnetic via 7, formed by a cylinder of magnetic material, and a sensing coil 8, surrounding at a distance the magnetic via 7 and approximately coaxial thereto. The magnetic via 7 extends perpendicular to the surfaces 2a and 2b (as allowed by electronic manufacturing techniques). Moreover, as visible in FIG. 2, the magnetic via 7 has a circular or slightly elliptical cross-section so that the magnetic material of the magnetic via 7 does not appreciably alter the field lines of the magnetic field oriented parallel to the plane XY.

In this embodiment, the magnetic via 7 extends through the entire thickness of the chip 2 and encloses an electrically insulating material 9, for example an oxide, a dielectric, or a polymer.

The sensing coil 8 is connected to an electronic circuit 10, represented schematically and integrated in the chip 2. Moreover electrical connections 11 to the outside are formed in the insulating layer 4, in a known manner.

The magnetic via 7 is formed by a thin ferromagnetic material layer, for example soft ferromagnetic (soft magnetic) material, such as a nickel-based, cobalt-based, or iron-based alloy, and has a thickness comprised, for example, between 0.1 and 10 µm, preferably between 0.5 and 2 µm, and still more preferably between 0.9 and 1.1 µm. Moreover, the magnetic via 7 has a height preferably greater than or equal to the diameter, more preferably much greater than the diameter, for example, a height not smaller than 10 µm and a diameter greater than 1 µm. The magnetic via 7, for example, may have a height greater than 30 µm and a diameter greater than 10 µm.

In general, the height of the magnetic via 7 may be considerable (even 100 μm), in so far as it is possible to use chips of large thickness.

Figure 2:
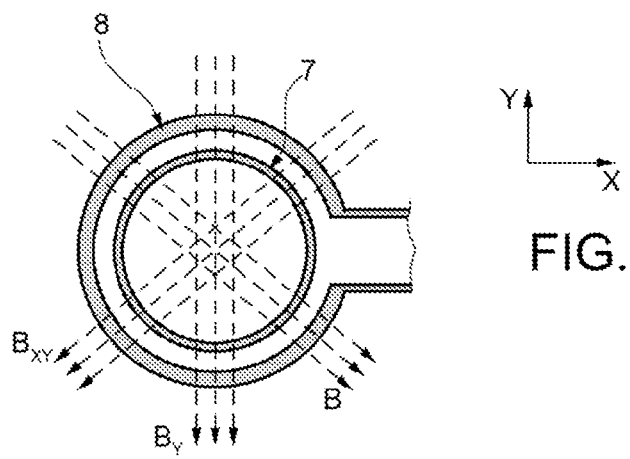
FIG. 2 shows a cross-section, taken along section plane II-II of FIG. 1, of a detail of the sensor of FIG. 1, illustrating the plot of planar magnetic fields.

The sensing coil 8 is a conductive material, preferably metal, such as copper, aluminum, tungsten, gold, silver, and may comprise a turn 2, as shown in FIG. 2, or a plurality of concentric turns, arranged on one or more metallization levels, extending, to a first approximation, in one or more planes parallel to the surfaces 2a, 2b so that the turns surround and preferably are arranged at a minimum distance from the magnetic via 7 (taking into account the technology and the tolerances), as shown in the enlarged detail of FIG. 1. The sensing coil 8 may have for example a hexagonal, octagonal, or preferably circular shape. In particular, the sensing coil 8 has a small depth (for example, a few microns).

Thereby, the flux lines of a vertical magnetic field $B_z$ (or of a component of magnetic field directed along axis Z) are concentrated by the magnetic via 7 according to the equation $$B_z = \mu_R H_z$$

where $\mu_R$ is the magnetic permeability of the material of the magnetic via 7.

Consequently, if the vertical magnetic field $B_z$ is variable, albeit slowly, it gives rise to a current correlated to the value of the vertical magnetic field $B_z$. This current is supplied and processed by the electronic circuit 10 to determine the parameters of the external magnetic field.

The magnetic sensor 1 is, however, able to detect vertical magnetic fields $B_z$ that are even constant when the magnetic sensor 1 is moving in space.

Figure 3:
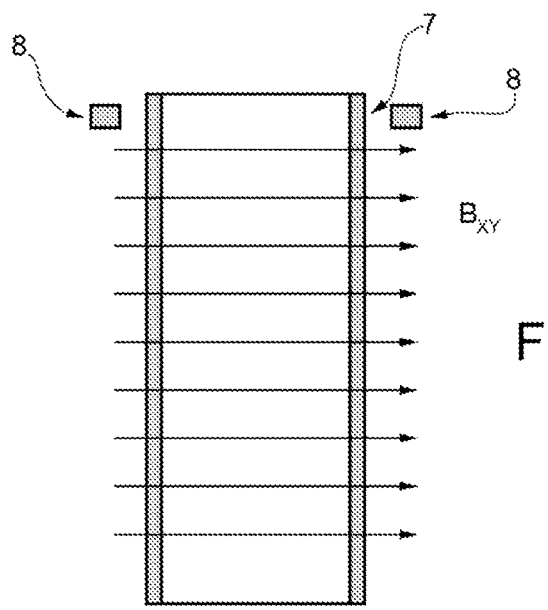
FIG. 3 shows the plot of planar magnetic fields for the detail of FIG. 2, in the cross-section of FIG. 1.

The magnetic sensor 1 provides a reliable measurement of vertical magnetic fields, since it is not affected by possible horizontal magnetic fields (in the XY plane) and does not deform them. In fact, as shown in FIGS. 2 and 3, which show flux lines of horizontal fields $B_Y$ and $B_{XY}$ (but the same applies to field $B_X$), thanks to the small thickness of the ferromagnetic layer (formed by a thin film) defining the magnetic via 7, the horizontal fields cross the magnetic via 7 remaining practically unaltered, without being concentrated or modified. The insensitivity as to horizontal magnetic fields is ensured also by the absence of plane surfaces parallel to the X or Y axis in the magnetic via 7, by virtue of the cylindrical, slightly elliptical, or in general curvilinear section of the latter and the absence of bottom sides. The above horizontal fields are not detected by the sensing coil 8 either. In fact, this is unable to concatenate magnetic flux, since it lies in the XY plane and is parallel to the field lines of the horizontal magnetic fields. The sensing coil 8 thus detects the vertical fields $B_z$, by virtue of its substantially planar structure lying in the XY plane.

The magnetic sensor 1 is thus able to intercept the vertical component of external magnetic fields, albeit of small amplitude, and to reject the horizontal components, increasing the directivity, precision, and reliability as compared to known sensors.

The magnetic sensor 1 may be formed according one embodiment shown in FIGS. 4-7.

Figure 4:
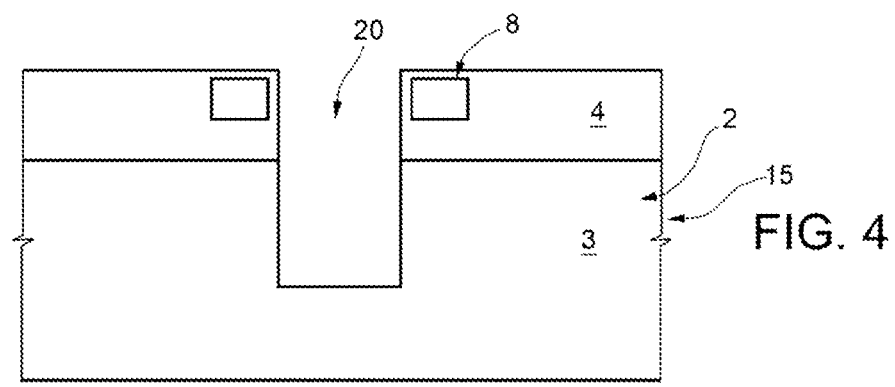
FIGS. 4-7 show sections similar to FIG. 1, in subsequent manufacturing steps of the sensor in accordance with one embodiment.

Initially, a wafer 15 of semiconductor material containing the chip 2 is subjected to manufacturing steps typical of the electronic industry to obtain the circuit 10, the electrical connections 11, and the sensing coil 8 in the insulating layer 4 (FIG. 1). In particular, the sensing coil 8 is a conductive material deposited and appropriately shaped on one or more levels and electrically connected together by conductive vias, and insulated by the material of the insulating layer 4. As shown in FIG. 4, the wafer 15, after masking, is anisotropically etched to form a deep cavity 20 extending through the entire insulating layer 4 and most of the body 3. The deep cavity 20 has the external shape of the magnetic via 7 to be formed and thus is circular or slightly elliptical in plan view.

As an alternative to chemical etching, laser drilling may be carried out.

Figure 5:
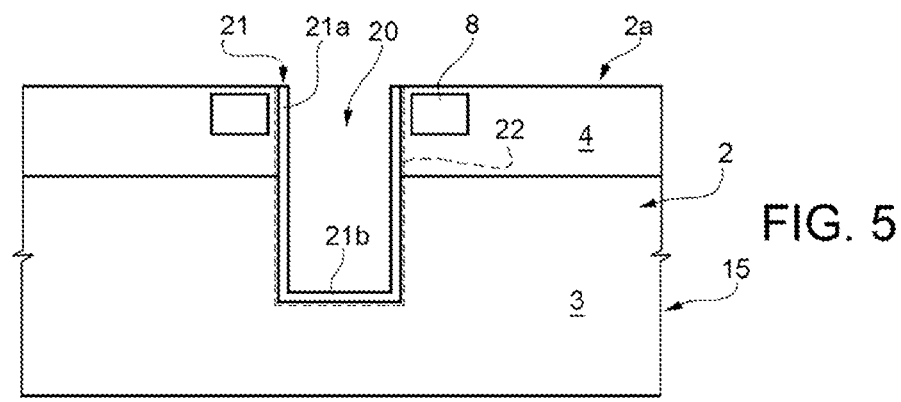

As shown in FIG. 5, a ferromagnetic layer 21 is deposited on the first surface 2a and on the walls and bottom of the deep cavity 20. The ferromagnetic layer 21 is then removed from the first surface 2a of the chip 2, for example via CMP (Chemical Mechanical Polishing). In this way, on the walls and on the bottom of the deep cavity 20 an annular region 21a and a bottom region 21b are formed. In a variant, prior to depositing the ferromagnetic layer 21, a barrier layer 22 (indicated by a dashed line only in FIG. 5) may be deposited. The barrier layer 22 may, for example, be of a material chosen among titanium, tantalum, titanium alloy, including TiN and TiW, tantalum alloy, including TaNTa and TaN, or other known materials and has the function of blocking diffusion of elements of the ferromagnetic layer 21 that may contaminate the integrated circuit 10, thereby altering operation thereof and reducing the reliability of the magnetic sensor 1.

According to another variant, before forming the deep cavity 20, a sacrificial layer (not shown) is deposited on the first surface 2a, for example silicon oxide, and is removed after removing the surface portions of the ferromagnetic layer 21 from the first surface 2a via CMP.

Figure 6:
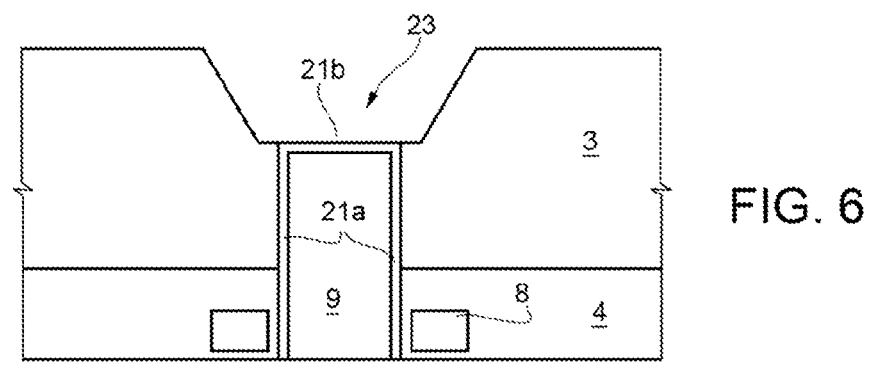

As shown in FIG. 6, the deep cavity 20 is filled with the electrically insulating material 9, for example an oxide or a polymer, the wafer 15 is flipped over and, by masking and etching, a second cavity 23 is formed and extends from the second surface 2b to the bottom 21b or close to the bottom 21b of the ferromagnetic layer 21, exposing the latter. The geometrical features of the second cavity 23 are not important. In the illustrated embodiment, the second cavity 23 is shown tapered, but it is to be appreciated that the bottom of the second cavity 23 may be aligned and of dimensions comparable to or even greater than the bottom 21b of the ferromagnetic layer 21.

Figure 7:
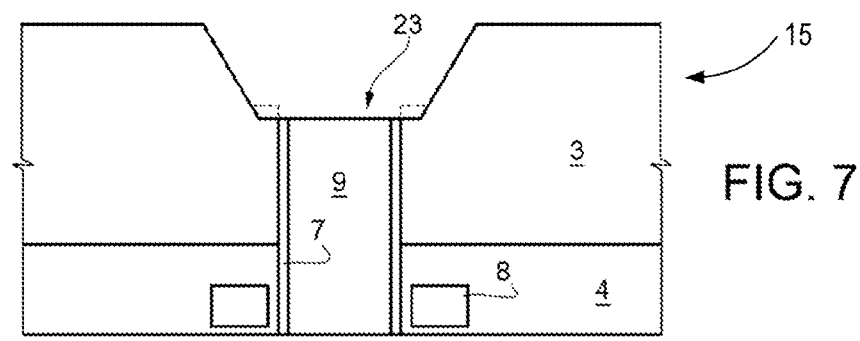

If the bottom 21b is exposed, it may then be removed directly by etching the ferromagnetic material from the back. Alternatively, if the bottom 21b is not exposed, the remaining portion of the body 3 underneath the bottom 21b of the ferromagnetic layer 21 and the bottom 21b may be removed using a laser (for example, by laser drilling). Laser drilling (which may be carried out also when the bottom 21b is exposed) may be performed either from the back (second surface 2b) or from the front (first surface 2a), in which case it is not necessary to form the second cavity 23. After removing the bottom 21b of the ferromagnetic layer 21, the structure of FIG. 7 is obtained, where the remaining portion of the ferromagnetic layer 21 forms the magnetic via 7.

Finally, the wafer 15 is thinned and planarized from the back and diced so as to obtain a plurality of chips 2 of the type shown in FIG. 1.

Alternatively, after forming the ferromagnetic layer 21 and filling the deep cavity 20, the wafer 15 is thinned without forming the second cavity 23. In this case, by back lapping, the rear portion of the body 3 may be removed as far as the bottom 21b of the ferromagnetic layer 21 and the bottom 21b is removed, thereby arriving, after dicing the wafer 15, to the structure of FIG. 1.

According to an embodiment, by appropriately calibrating the deposition process of the ferromagnetic layer 21 and selecting appropriate geometrical dimensions of the cavity 20, it is possible to get the ferromagnetic layer 21 to coat only the annular region 21a and be absent from the bottom region 21b. In this case, it is not necessary to form the second cavity 23.

According to another alternative, after forming the second cavity 23 and removing the bottom 21b of the ferromagnetic layer 21, the wafer 15 cannot be thinned. In this case, it is possible to fill the second cavity 23 with insulating or dielectric material, for example, a polymer or an oxide, and the magnetic via 7 extends for part of the thickness of the chip 7, for example through the insulating layer 4 or through the insulating layer 4 and part of the body 3 (as shown, for example, in FIG. 8).

The chip 2 may be packaged so as to form the magnetic sensor 1 or a more complex sensor, for example a fluxgate sensor, as shown in FIGS. 8-12, the formation details whereof may even be combined so as to obtain different hybrid embodiments with respect to what is shown.

Figure 8:
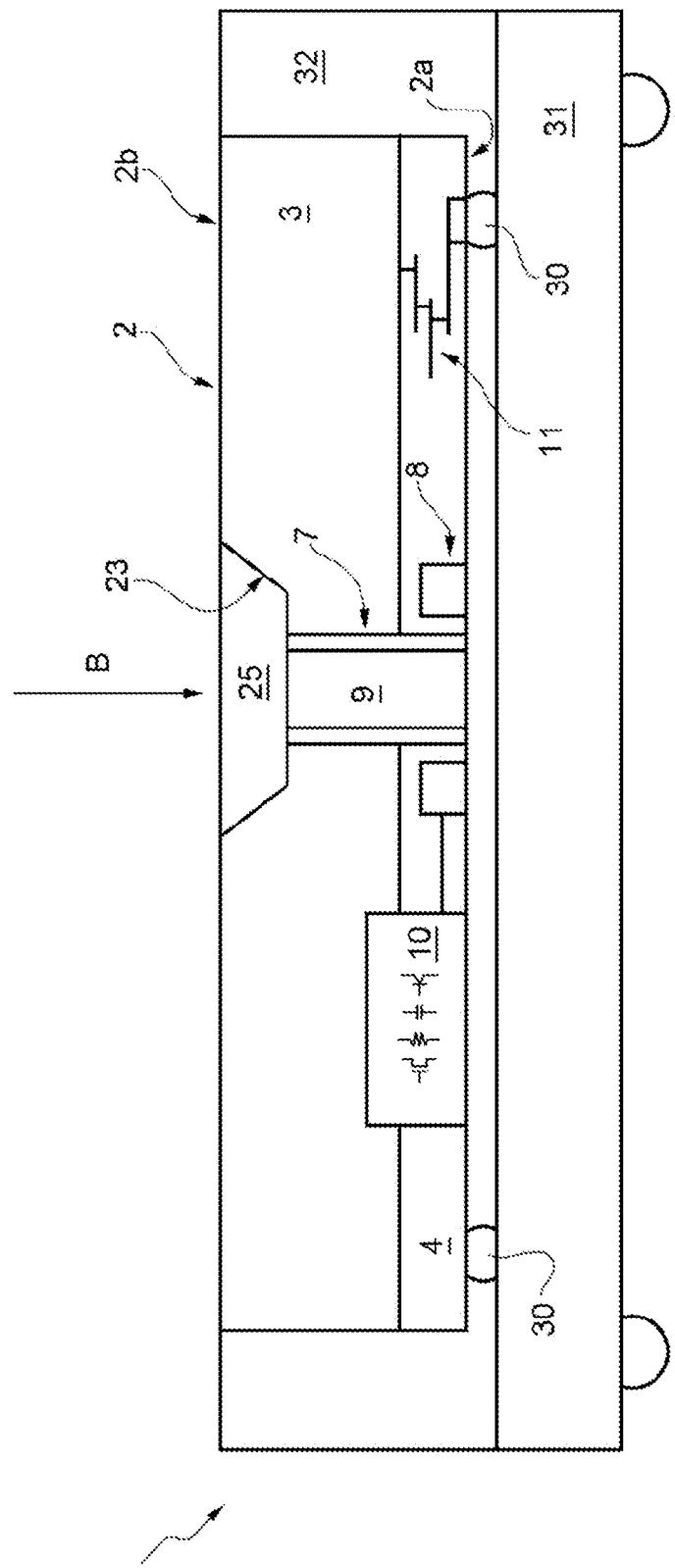
FIG. 8 shows the assembly of the sensor of FIG. 1 in a packaged device.

In FIG. 8, the chip 2 is not thinned, so that the second cavity 23 is filled with insulating or dielectric material 25. Moreover, the chip 2 is bonded, through conductive bumps 30 adhering to the first surface 2a or to a support 31, for example a printed circuit or other semiconductor substrate, for instance to a different chip accommodating its electronic components and/ or circuits. The chip 2 is moreover surrounded, at least laterally, by packaging material 32, for example molded, which exposes the second surface 2b of the chip 2. As an alternative thereto, the chip 2 may be flipped over and bonded directly to the support 31 and be electrically connected to the latter via conductive wires (wire bonding), without interposition of the conductive bumps 30. In this way, the chip 2 is surrounded laterally and overlaid by the packaging material 32.

Figure 9:
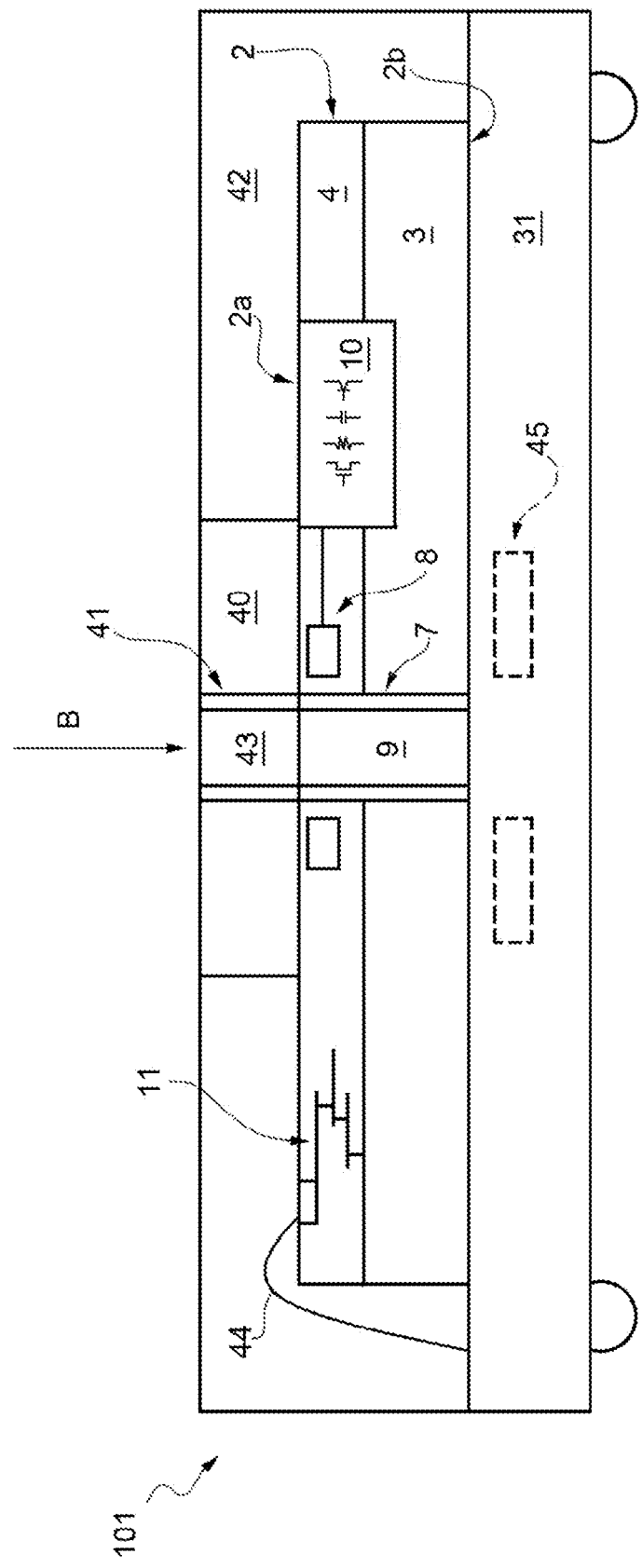
FIGS. 9 and 10 show different embodiments of the device of FIG. 8.

FIG. 9 shows a magnetic sensor 101 wherein an auxiliary substrate 40 is bonded to the chip 2 on its first surface 2a and is provided with an auxiliary via 41, of ferromagnetic material. The auxiliary via 41 is congruent with the magnetic via 7 and thus has approximately the same internal and external diameters and is coaxial with and aligned to the magnetic via 7 of the chip 2 so as to form a prolongation thereof. In addition, the magnetic via 7 extends through the entire thickness of the chip 2, and the latter is flipped over with respect to FIG. 8 and bonded to the substrate 31 on its second surface 2b. Here, packaging material 42 envelops the chip 2 also at the top, while the auxiliary substrate 40 and the auxiliary via 41 are exposed to the outside. The auxiliary via 41 may be filled with insulating or dielectric material 43, and the electrical circuit 10 is connected to the support 31 by the electrical connections 11 and wire connections 44.

This solution increases the directivity and the sensitivity of the magnetic sensor 1, increasing the length of the magnetic lines concentrating cylinder.

The support 31 may accommodate an excitation coil 45, substantially coaxial with the magnetic via 7 and possibly connected to the electronic circuit 10. In this case, the magnetic sensor 101 defines a vertical fluxgate sensor, the excitation coil 45 whereof generates a quasi-saturation condition of the ferromagnetic material of the magnetic via 7 and of the auxiliary via 41. In this condition, the magnetic sensor 101 is able to detect external vertical constant magnetic fields even when the magnetic sensor is stationary.

Figure 10:
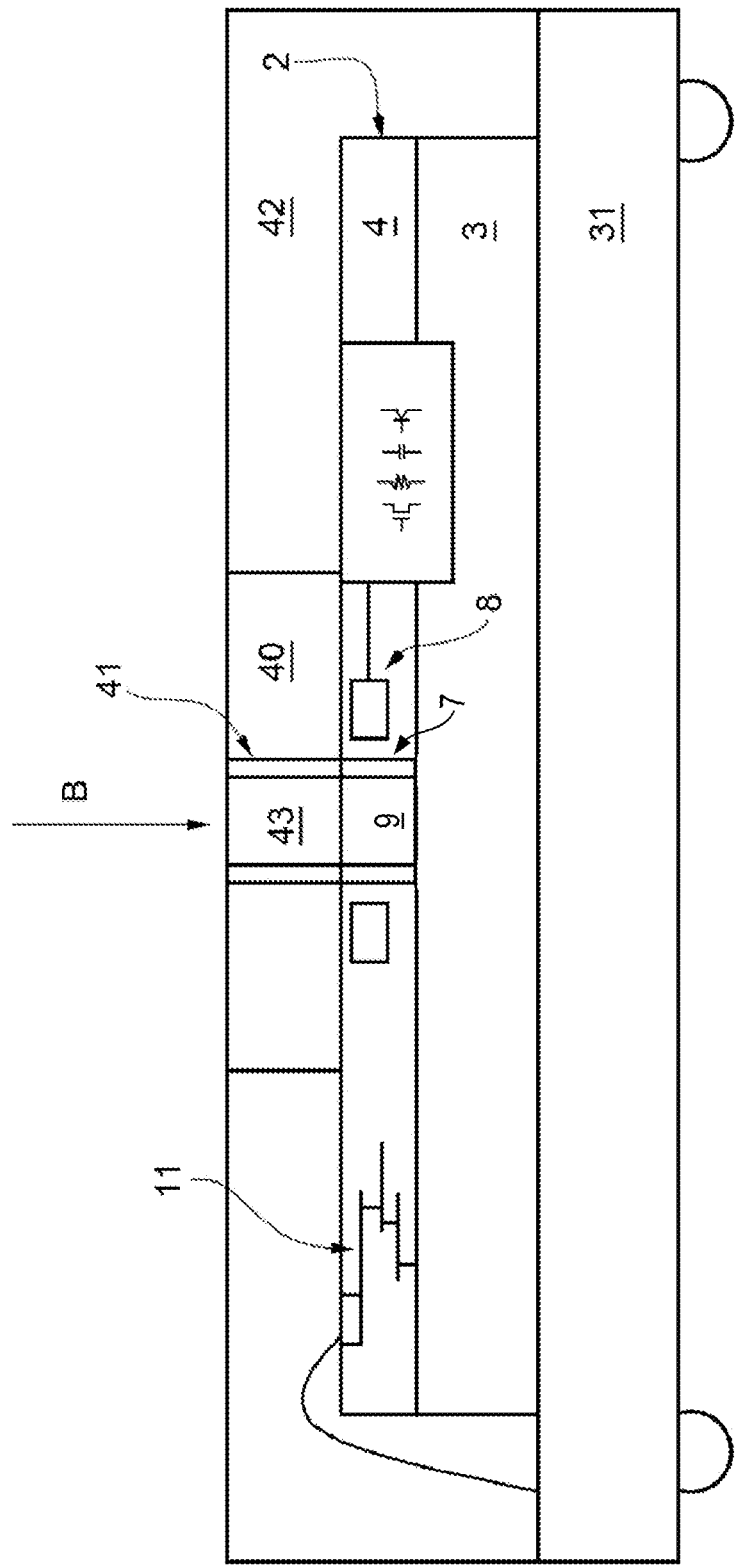

FIG. 10 shows a variant of the embodiment of FIG. 9, where the magnetic via 7 extends through the insulating layer 4, and not through the body 3. In any case, the sensing coil 8 surrounds the magnetic via 7 and is thus able to detect vertical components of the magnetic field concentrated by the magnetic via 7.

Also in this case, an excitation coil 45 (not shown) may be provided. Moreover, the auxiliary substrate 40 may be absent (as in FIG. 1).

In FIG. 11, the magnetic sensor is formed by a double fluxgate sensor in a package-on-package configuration. In detail, here first and second chips 201, 202, each of which forms an elementary fluxgate sensor, are arranged on top of each other, with the respective magnetic vias 7 mutually coaxial and congruent and the respective sensing coils 8 vertically aligned and coaxial. The chips 201, 202 are formed substantially as described above for to the various embodiments of the chip 2.

An intermediate substrate 50 is arranged between the two chips 201, 202 accommodating an excitation coil 51, common to the two chips 201 and 202 and coaxial to the sensing coils 8. The ensemble of the two chips 201, 202 and of the intermediate substrate 50 is carried by a base substrate 52.

In the example shown, the first chip 201 is bonded to the base substrate 52 at its first surface 2a and the second chip 201 is flipped over and bonded to the intermediate substrate 50 with its second surface 2b, but the chips 201, 202 may be arranged in the same way (with the insulating layer 4 at the top or at the bottom, with reference to FIG. 11).

In detail, the first chip 201 is packaged in a respective packaging material 232 and is bonded to the base substrate 52 via conductive bumps 53 arranged between the insulating layer 4 of the first chip 201 and the base substrate 52. The intermediate substrate 50 is directly bonded to the base substrate 52 via adhesive and conductive bumps 55 arranged laterally with respect to the first chip 201. Alternatively, the first chip 201 may be bonded directly also to the intermediate substrate 50.

The second chip 202 is directly bonded to the intermediate substrate 50 with its body 3 and is packaged in a respective packaging material 233 that also envelops the insulating layer 4.

The magnetic sensor of FIG. 11 operates as a double fluxgate sensor and is particularly directive and sensitive. By virtue of the stacking of two elementary sensors, it is possible to use rather thin chips 201, 202, each the magnetic via 7 whereof may have a lower height than the magnetic sensor 1.

According to a variant of the magnetic sensor of FIG. 11, a magnetic via may be formed also in the intermediate substrate 50, thus increasing even more the directivity and sensitivity of the magnetic sensor.

Moreover, the chips 201, 202 may be replaced by more complex systems, such as SiPs (Systems in Package), accommodating a chip 2 of the type described above.

In the embodiment of FIG. 12, a sensor 101 of the type shown in FIG. 9 is bonded on each side of an intermediate support 60, for example a printed circuit board. To this end, conductive bumps 61 are provided between each support 31 and the intermediate support 60. Also here, the magnetic vias 7, 41 of the two sensors 101 are vertically aligned to each other, and the magnetic vias 35 and 62 may also be formed in the supports 31 and in the intermediate support 60, respectively.

Here, an excitation coil 45 is formed in each support 31 and the sensors 101 constitute fluxgates. The excitation coils 45 in the two supports 31 may be electrically connected together so as to be traversed by the same current in order to simplify the system and generate a same magnetic field. Alternatively, the excitation coils 45 could be independent of each other.

In an embodiment (not shown), if the magnetic vias 35 and 62 are present, the excitation coils 45 may be omitted and replaced by an equivalent coil in the intermediate support 60.

Finally, it is clear that modifications and variations may be made to the magnetic sensor described and illustrated herein without thereby departing from the scope of the present disclosure.

For example, the magnetic via 7 may not be filled with material and be hollow, or be filled in part with material 9, 43; for example, the material may cover only on the lateral surface of the magnetic via 7.

Moreover, in addition to the barrier layer 22 external to the ferromagnetic layer 21 of the magnetic via 7, a barrier layer may also be formed between the insulating material 9 and the ferromagnetic layer 21.

In general, the cross-section of the magnetic via 7 could be curvilinear so as not to appreciably alter the field lines of the magnetic field according to the XY plane, as has been discussed above.

Finally, the sensing coil 8 may surround a plurality of magnetic vias 7 provided in the magnetic sensor 1; 101; 201, 202.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An integrated magnetic sensor comprising:
a first chip having a first surface;
a magnetic via located in the first chip, the magnetic via including a cylindrical layer of ferromagnetic material that extends to the first surface of the first chip and has, in cross-section, an annular shape;
a sensing coil located in the first chip and surrounding the magnetic via at a distance, the sensing coil being configured to produce a current in response to an external magnetic field; and
an electronic circuit electrically coupled to the sensing coil and configured to process the current from the sensing coil and determine parameters of the external magnetic field.

2. The sensor according to claim 1, wherein the first chip includes a body of semiconductor material having a thickness, and an insulating layer overlying the body and having a thickness, wherein the magnetic via extends through the thickness of the insulating layer and the sensing coil extends in to the insulating layer.

3. The sensor according to claim 2, wherein the magnetic via further extends into at least part of the thickness of the body of semiconductor material.

4. The sensor according to claim 3, wherein a surface of the insulating layer is the first surface of the first chip, and the body forms a second surface of the first chip and includes a cavity proximate the magnetic via, the cavity extending between the magnetic via and the second surface.

5. The sensor according to claim 1, wherein the magnetic via comprises a ferromagnetic material layer wall having a thickness between about 0.1 and 10 μm.

6. The sensor according to claim 5, wherein the wall thickness of the ferromagnetic material layer is between about 0.9 and 1.1 μm.

7. The sensor according to claim 1, wherein the magnetic via comprises a layer of soft ferromagnetic material that is one of nickel-based, cobalt-based, or iron-based alloy.

8. The sensor according to claim 1, comprising an auxiliary substrate bonded to the first surface of the first chip and having an auxiliary via of ferromagnetic material extending therethrough, the auxiliary via being at least one of coaxial, congruent, and contiguous with respect to the magnetic via.

9. The sensor according to claim 1, comprising a substrate supporting the first chip and a packaging material at least laterally surrounding the first chip.

10. The sensor according to claim 9, further comprising an excitation coil in the substrate that is coaxial with the sensing coil, and wherein the sensor forms a fluxgate sensor.

11. The sensor according to claim 9, wherein the first chip includes an electronic circuit and interconnection lines; the sensor further including interconnection structures extending between the interconnection lines and the substrate.

12. The sensor according to claim 1, comprising a second chip having a respective magnetic via and a respective sensing coil and being arranged on the first chip, the magnetic vias of the first and second chips being coaxial to each other, and the sensing coils of the first and second chips being coaxial to each other.

13. The sensor according to claim 12, further comprising an intermediate support arranged between the first and second chips.

14. The sensor according to claim 13, wherein the intermediate support further comprises an intermediate via of ferromagnetic material, coaxial with the magnetic vias of the first and second chips.

15. The sensor according to claim 1, wherein the first chip has a deep cavity extending from the first surface and accommodating the magnetic via therein, the deep cavity having a side wall coated with a barrier layer surrounding the magnetic via.

16. The sensor according to claim 1 wherein the annular shape is one of circular, elliptical, or curvilinear.

17. A magnetic sensor comprising:
a semiconductor body having a first surface and a second surface;
a magnetic via located in the semiconductor body that extends to the first surface of the semiconductor body, the magnetic via being cylindrical-shaped, the magnetic via including at least a cylindrical layer of ferromagnetic material that has, in cross-section, an annular shape;
a sensing coil located in the semiconductor body at a distance outwardly of the magnetic via, the sensing coil being configured to produce a current in response to an external magnetic field; and
an electronic circuit electrically coupled to the sensing coil and configured to process the current from the sensing coil and determine parameters of the external magnetic field.

18. The sensor according to claim 17, wherein the magnetic via includes an opening, and wherein an insulating material is located in the opening of the magnetic via.

19. The sensor according to claim 17, wherein the magnetic via is formed from a thin ferromagnetic material.

20. The sensor according to claim 17, wherein the magnetic via extends through a thickness of the semiconductor body from the first surface to the second surface.

21. The sensor according to claim 20, further comprising an insulating layer located over the first surface of the semiconductor body, the magnetic via extending through the insulating layer.

22. A stacked package comprising:
a first magnetic sensor including:
a first chip having a first surface and a second surface;
a first magnetic via located in the first chip and extending to the first surface, the first magnetic via having at least a central opening, and has, in cross-section, an annular shape; and a first sensing coil located in the first chip at a distance that is outwardly of the first magnetic via, the first sensing coil being configured to produce a current in response to an external magnetic field;

a second magnetic sensor, the second magnetic sensor including:

a second chip having a first surface and a second surface;

a second magnetic via located in the second chip and extending to the first surface, the second magnetic via having at least a central opening, and has, in cross-section, an annular shape; and a second sensing coil located in the second chip at a distance that is outwardly of the second magnetic via, the second sensing coil being configured to produce a current in response to an external magnetic field; and a substrate located between the first and second magnetic sensors; and an electronic circuit electrically coupled to the first sensing coil and configured to process the current from the first sensing coil and determine parameters of the external magnetic field.

23. The stacked package according to claim 22, wherein the substrate includes a first surface and a second surface, the first magnetic sensor being coupled to the first surface of the substrate and the second magnetic sensor being coupled to the second surface of the substrate.

24. The stacked package according to claim 22, wherein the substrate is a first substrate, the stacked package including a second substrate, wherein the first magnetic sensor is coupled to the first substrate and the second sensor is coupled to the second substrate, the first and second substrates being coupled together by conductive interconnections.

25. The stacked package according to claim 22, wherein an insulating material is located in the central openings of the first and second magnetic vias.

26. The sensor according to claim 1, wherein the magnetic via includes a central opening bounded by the layer of ferromagnetic material, the central opening filled with insulating material.

27. The sensor according to claim 1, wherein the magnetic via and the sensing coil are coaxial.

28. The sensor according to claim 17, wherein the magnetic via and the sensing coil are coaxial.

29. The stacked package according to claim 22, wherein the first magnetic via and the first sensing coil are coaxial.

\* \* \* \* \*